United States Patent
Pavlov et al.

(10) Patent No.: US 7,910,390 B2
(45) Date of Patent: Mar. 22, 2011

(54) RESONANT MEMS DEVICE THAT DETECTS PHOTONS, PARTICLES AND SMALL FORCES

(75) Inventors: Andrei Pavlov, Naantaki (FI); Yelena Pavlova, Naantaki (FI)

(73) Assignee: ScanNanoTek Oy, Turku (FI)

( * ) Notice: Subject to any disclaimer, the term of this patent is extended or adjusted under 35 U.S.C. 154(b) by 120 days.

(21) Appl. No.: 12/370,882

(22) Filed: Feb. 13, 2009

(65) Prior Publication Data

US 2009/0206953 A1    Aug. 20, 2009

Related U.S. Application Data

(60) Provisional application No. 61/064,084, filed on Feb. 15, 2008.

(51) Int. Cl.
*H01L 21/00* (2006.01)
*H01L 29/82* (2006.01)

(52) U.S. Cl. .......................................... 438/52; 257/415

(58) Field of Classification Search ................... 438/15, 438/50–53; 257/48, 415, E21.613, E29.324
See application file for complete search history.

(56) References Cited

U.S. PATENT DOCUMENTS

| | | | |
|---|---|---|---|
| 5,265,470 A | 11/1993 | Kaiser et al. | |
| 5,563,344 A * | 10/1996 | Kaiser et al. | 73/514.24 |
| 5,859,368 A | 1/1999 | Cargille | |
| 6,744,338 B2 * | 6/2004 | Nikitin | 333/262 |
| 7,095,295 B1 | 8/2006 | Stalford et al. | |

FOREIGN PATENT DOCUMENTS

WO    WO 93/00589    1/1993

OTHER PUBLICATIONS

Cheng-Hsien Liu et al., "A High-Precision, Wide-Bandwidth Micromachined Tunneling Accelerometer," Journal of Microelectromechanical Systems, vol. 10, No. 3, Sep. 1, 2001, pp. 425-433.

A. Pavlov, et al., "Proposal of Scanning Probe Microscope With Mems Cantilever For Study of Conductive and Non-Conductive Materials," Reviews on Advanced Materials Science, vol. 5, Jan. 1, 2003, pp. 324-328.
International Search Report and Written Opinion, dated Jul. 2, 2009, issued in Appln. No. PCT/IB2009/000259.

* cited by examiner

*Primary Examiner* — Calvin Lee
(74) *Attorney, Agent, or Firm* — Venable LLP; Robert S. Babayi

(57) ABSTRACT

A resonant MEMS device that detects photons, particles and small forces including atomic forces is disclosed. The device comprises a planar substrate 1, two electrodes 2 and 3 on top of the substrate, a resonant micro-electromechanical (MEMS) structure 6, such as a cantilever, anchored to first electrode 2 and arranged above the second electrode 3 separated from this electrode with an ultrathin transition layer 5. The resonant MEMS structure is working at its natural resonant frequency. The resonant oscillation of the cantilever can be initiated by applying AC voltage with frequency equaling the resonant frequency of the MEMS structure. A constant voltage is applied between the cantilever and the second electrode. The cantilever oscillates at very small amplitude ranging from few Ångstrom (Å) to several nm. During operation, a constant component of the electrical current is measured between the cantilever and the second electrode 3. The electrical current is a tunnelling current described by quantum mechanical probability with which the electrons can tunnel through the transition layer. The thickness of the transition layer is selected so that at no resonance the constant component of the electrical current is about zero and at resonance the DC electrical current has non-zero value and reaches its maximum. When the cantilever interacts with photons, particles or atoms on surfaces then the MEMS device measures their energies using change in the DC tunnelling current and shift of resonant frequency.

15 Claims, 16 Drawing Sheets

Matrix

MxN

RESONANT MEMS DEVICE THAT DETECTS PHOTONS, PARTICLES AND SMALL FORCES

CROSS-REFERENCE TO RELATED APPLICATIONS

This Non-provisional Application claims the benefit of U.S. Provisional Application Ser. No. 61/064,084, filed Feb. 15, 2008, which is incorporated by reference herein in its entirety.

FIELD OF THE INVENTION

The present invention relates to micro-electromechanical systems (MEMS) and, more particularly, to MEMS devices having a resonating micro-mechanical structure that induces tunnelling effect current for detection of very small particles, elementary particles, photons and very small forces.

BACKGROUND OF THE INVENTION

MEMS are devices having sub-millimeter-sized micromechanical components. Some MEMS have a resonating micro-mechanical structure that oscillates at its natural frequency. Resonator MEMS have been used in switches (U.S. Pat. No. 6,744,338 B2) and tunable capacitor application (U.S. Pat. No. 7,095,295 B1). The resonating micro-mechanical structures in these devices comprises a cantilever that resonates within a relatively large gap of a few thousand Ångstroms to few microns. Such large gap accommodates the large oscillation amplitude of the cantilever, and a relatively large amount of energy is required for causing the cantilever to oscillate within the gap.

In switching applications, a known MEMS device uses the mechanical connection between an electrode or contact associated with a resonating micro-mechanical structure and a switch electrode or contact. In situations where two surfaces scaled in the micrometer ranges come into close proximity, such surfaces may adhere to each other because, at such small scale, electrostatic (and/or Van der Waals) forces become significant producing a problematic phenomena known as stiction. MEMS switches suffer from stiction when the different electrical potentials applied to the electrodes reduces switching reliability.

In quantum mechanics, tunnelling effect (also known as quantum tunnelling) is a nanoscopic phenomenon in which a particle violates the principles of classical mechanics by penetrating a potential barrier or impedance higher than the kinetic energy of the particle. Such tunnelling effect has been used in a known MEMS tunnelling/capacitive sensor (U.S. Pat. No. 6,835,587 B2), which has a cantilevered resonator structure with a gap size of about 3,000 Å.

Scanning tunnelling microscope (STM) is a technique for viewing surfaces at the atomic level. The STM is based on the concept of quantum tunnelling. When a conducting tip is brought very near to a metallic or semi-conducting surface, a bias between the two can allow electrons to tunnel through the vacuum between them. For low voltages, this tunnelling current is a function of the local density of states (LDOS) at the Fermi level, $E_f$, of the sample. Variations in current as the probe passes over the surface are translated into an image.

Oscillating cantilevers have been used in atomic force microscopy (AFM). In such applications, external laser beam detection systems measure the deflection angle of the cantilever using a feedback mechanism. The relatively large size of the cantilevers allows for the detection of laser beam reflections from probed surfaces. Large cantilevers, however, do not allow for detection of extremely small deflection angles that are necessary for high resolution microscopy. This is because such angles are difficult to measure due to optical limitations associated with diffraction in laser beams.

Accordingly, the prior art MEMS devices have resolution limitations for detecting very small forces, such as, atomic forces and photons. Therefore, there exists a need for a MEMS device that provides higher detection resolution.

SUMMARY OF THE INVENTION

Briefly, according to the present invention, a resonant MEMS device comprises a substrate; at least one sensor electrode disposed on the substrate, a very thin transition layer having a thickness in the range of 0.5 Å to 100 Å coupled to the sense electrode, and a micro-mechanical structure that resonates at an oscillation amplitude and an oscillation frequency. The micro-mechanical structure is coupled to the at least one sense electrode through the transition layer allowing for the flow of one or more electrons caused by a tunnelling effect. At least one control voltage controls the tunnelling effect for sensing, at the at least one sensor electrode, an electrical characteristic associated with a change in either the oscillation amplitude or oscillation frequency of the micro-mechanical structure or both. The electrical characteristic can be either an amplitude, phase or frequency characteristic or any combination of them.

According to some of the more detailed features of the invention, the at least one control signal comprises a first control signal applied to the at least one sensor electrode and a second control signal applied to the micro-mechanical structure. In one embodiment, the at least one control voltage is adjustable for changing at least one of the oscillation amplitude or oscillation frequency of the micro-mechanical structure. The at least one control voltage can be either an AC voltage or a DC voltage. In one embodiment, the frequency of the AC voltage is substantially equal to the oscillation frequency of the micro-mechanical structure. The frequency of the AC voltage can be adjustable for changing either the oscillation amplitude or oscillation frequency of the micro-mechanical structure or both. The DC control voltage can be applied to the sensor electrode and the AC control voltage can be applied to the micro-mechanical structure or vice versa.

According to some of the more detailed features of the invention a first sensor electrode and a second sensor electrode are insulated from each other on the substrate and first control voltage is applied to the first sensor electrode and a second control voltage is applied to the second sensor electrode.

A MEMS system based on the MEMS device of the invention further includes a processing unit that controls at least one control voltage in response to a change in the electrical characteristic sensed at the sensor electrode. In one embodiment, the processing unit adjusts the control voltage to maintain at least one of the oscillation amplitude or oscillation frequency of the micro-mechanical structure at a reference. In another embodiment, the processing unit processes sense signals associated with the flow of electrons due to external forces acting on the micro-mechanical structure after adjusting the control voltage to set a reference associated with flow of the one or more electrons. In still another embodiment, the processing unit adjusts the control voltage to prevent the flow of the one or more electrons when the micro-mechanical structure is at resonance.

A method of producing the resonant MEMS device of the invention creates an insulation layer on top of a substrate and dispose at least one sensor electrode on the insulation layer. The method further couples a transition layer having a width in the range of 0.5 Å to 100 Å to the sense electrode and couples a micro-mechanical structure that resonates at an oscillation amplitude and an oscillation frequency to the at least one sense electrode through the transition layer for the flow of one or more electrons caused by a tunnelling effect. The method controls the tunnelling effect by means of at least one control voltage and senses, at the at least one sensor electrode, an electrical characteristic associated with a change in the oscillation amplitude or oscillation frequency of the micro-mechanical structure.

DETAILED DESCRIPTION OF THE INVENTION

Figure 1:
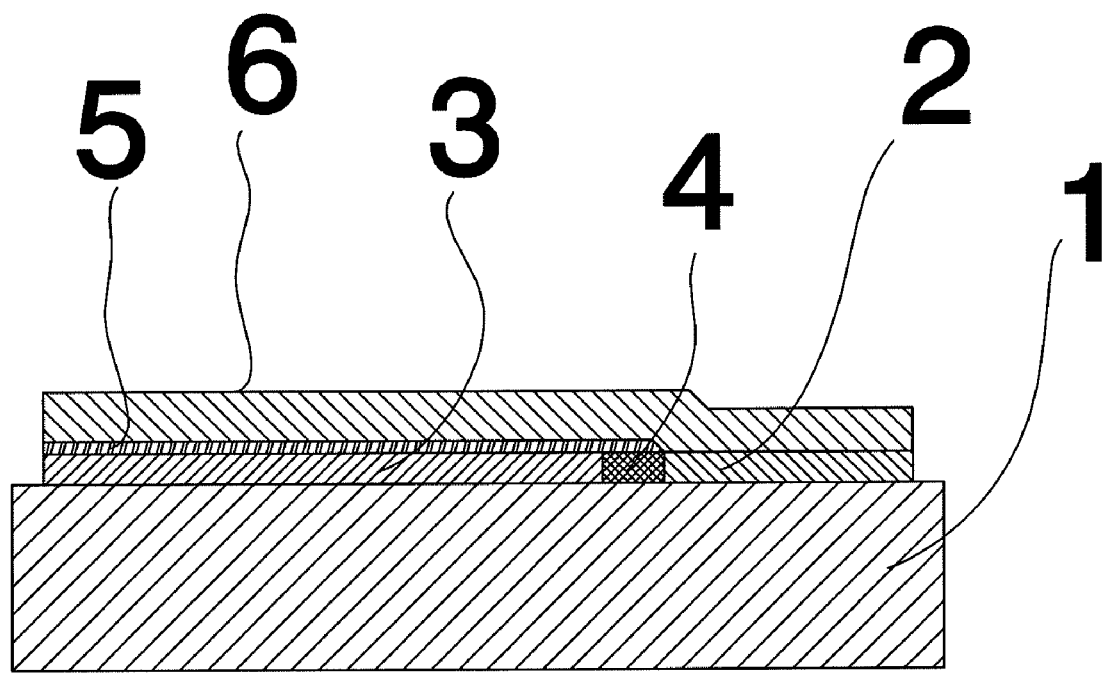
FIG. 1 shows a side view of a MEMS device according to an exemplary embodiment of the invention.

The resonant MEMS device according to the present invention includes a micro-mechanical structure disposed on a substrate via a resonator electrode that is electrically insulated from a sensor electrode. A thin transition medium having a thickness in the range of 0.5 Ångstrom (Å) to 100 Ångstrom (Å), made of suitable material is disposed between the sensor electrode and the micro-mechanical structure within a relatively small gap, herein after called a nano-gap in the range of 0.5 angstrom (Å) to 100 angstrom (Å). The micro-mechanical structure is designed to have a relatively small maximum oscillation amplitude at its natural frequency as defined by the material and geometry of the micro-mechanical structure and/or the transmission medium. The maximum oscillation amplitude is coupled to the transmission medium to enable flow of tunnelling electrons in such a way that any relative change in oscillation amplitude due to an external force corresponds to one or more properties associated with the flow of tunnelling electrons within the transition mediums, including the magnitude, frequency and phase of the electron flow. Such changes can be measured and correlated with properties associated with the nature of the external force to detect very small particles, elementary particles, photons, atomic forces, waves, and small mechanical forces. The present invention also correlates the properties associated with the flow of tunnelling electrons, the magnitude, frequency and phase of the tunnelling electron, with the magnitude of the external force. It has been noted that the weakest external forces impacting the oscillation amplitude of the micro-mechanical structure correlate with the magnitude of the tunnelling current associated with the tunnelling electrons and the strongest external forces correlate with a frequency shift of the tunnelling electrons. Intermediate strength external forces correlate with the phase of the tunnelling electrons.

The nano-gap defines the transition medium through which electrons can tunnel from the micro-mechanical structure, at resonance, towards the sensor electrode according to quantum mechanical probability principles. In one embodiment, the tunnelling probability is near zero at no resonance, and such probability is non-zero at resonance, resulting in the flow of tunnelling current between the micro-mechanical structure and the sensor electrode. The small oscillation amplitude of the resonating micro-mechanical structure in the range of 0.5 Ångstrom (Å) to 100 Ångstrom (Å) significantly increases detection resolution, for example, in scanning, imaging or microscopy applications. In one exemplary application, the MEMS device of the invention can be used for detection of very small particles, photons, or small forces including atomic forces. The micro-mechanical structure can be made of any suitable oscillating body including a cantilever, membrane or other resonating MEMS structures. As described further below, electrical signals applied to the MEMS device control the tunnelling process.

A probe that incorporates the MEMS device of the present invention operates based on the interaction of a small particle, e.g., photon, or small force, e.g., atomic force, with the resonating micro-mechanical structure. The interaction produces an electron that tunnels through an electric field barrier according to quantum mechanical probability as further described below. The tunnelling electron travels through the transition medium, e.g., a transition layer, towards the sensor electrode, where it is detected based on a measured component of the electric current. In an exemplary embodiment, the measurement is limited to a DC component of the electric current as opposed to the entire current. This measurement technique significantly simplifies the measurement procedure and circuitry. Alternatively, the tunnelling electron can charge a capacitor or other structure capable of keeping electric charge to record information about the tunnelling process. Various parameters that correlate with intensity of incident light, number of particles or a force magnitude can be detected based on a measured magnitude of the tunnelling current, shift in the oscillation frequency of the micro-mechanical structure, phase variations, or any of these properties combinations that may correlate with intensity of the incident light, number of particles or a force magnitude.

FIG. 1 depicts a MEMS device comprising a substrate 1, planar sensor electrodes 2 and planar resonator electrode 3 disposed on top of the substrate 1. The electrodes 2 and 3 are separated from each other by an insulation region. A thin transition layer 5 in the range of 0.5 Ångstrom (Å) to 100 Ångstrom (Å) covers the sensor electrode 3. Preferably, the transition layer has a level of elasticity allowing compression of a few Ångstroms over its length. A resonating micro-mechanical structure 6 is anchored at one end on top of the resonator electrode 2 and placed on top of the transition layer 5 above the sensor electrode 3. The transition layer 5 has a thickness in the range of few Ångstroms to few nanometers.

At no resonance, the transition layer 5 provides electrical isolation between the micro-mechanical structure 6 and the sensor electrode 3. At resonance, the transition layer 5 provides a tunnelling medium through which electrons can tunnel between the micro-mechanical structure 6 and the sensor electrode 3.

Figure 2:
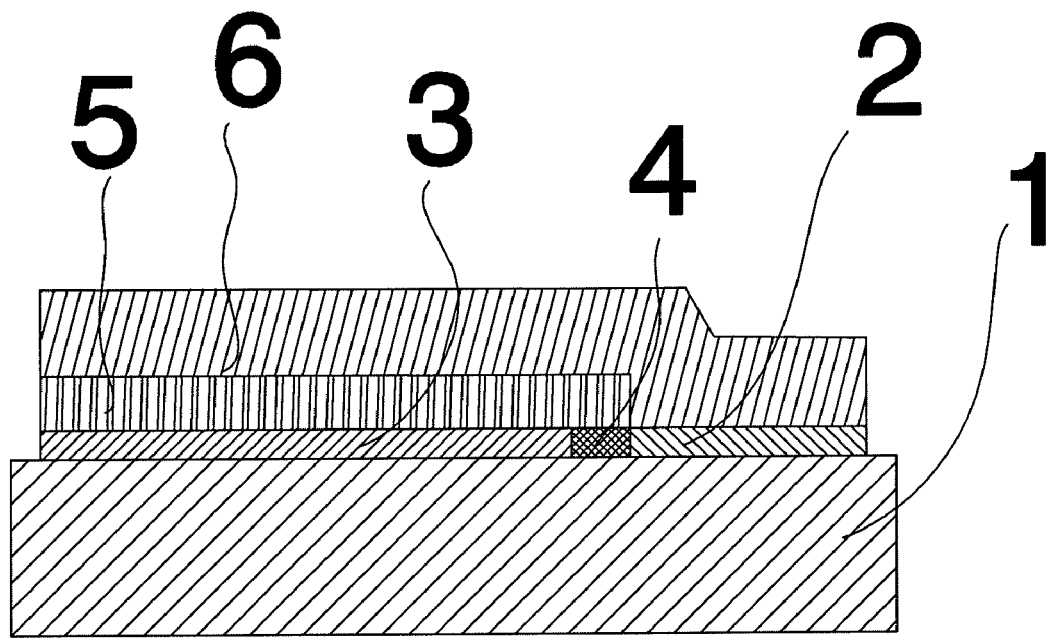
FIG. 2 shows a side view of the MEMS device of FIG. 1 with a transition layer made of nanotubes.

Preferably, the transition layer provides electrical resistance at no resonance and has a level of elasticity that enables deformation of at least of few Å over the length of the sensor electrode 3. If, for example, the length of the transition layer 5 is 50 um and the amplitude of oscillation is 5 Å, then relative deformation of the transition layer can be $1*10^{-5}$. The transition layer can be made of different materials ranging from crystalline materials, alloys, resistive polymers, liquids or air gap. The transition layer can also be used for amplification of the tunnelling effect current. For example, if the transition layer is made of nanotubes that are oriented vertically relative to a cantilever surface of the structure 6, then the tunnelling electrons travelling inside the nanotubes in an electric field can produce amplification via secondary electrons after collision with the walls of nanotubes. FIG. 2 shows the resonant MEMS device in which the transition layer is formed from nanotubes. In this case, the tunnelling effect current is amplified in the transition layer region.

Figure 3:
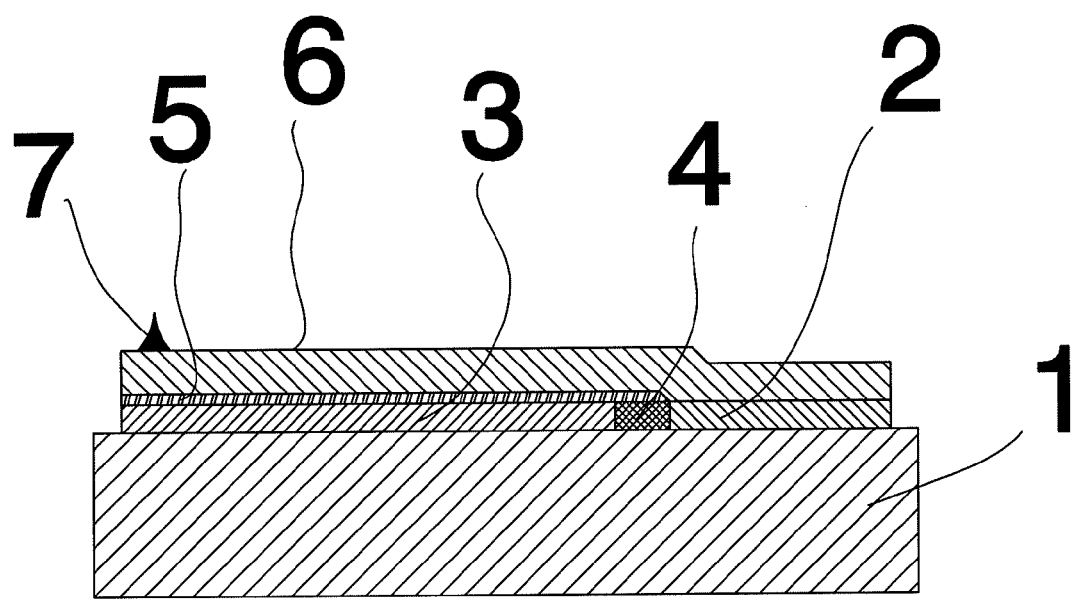
FIG. 3 shows a side view of an exemplary probe based on the MEMS device of the present invention.

It is known from scanning tunnelling microscopy (STM) that the tunnelling current changes significantly when the gap between the STM probe and a sample's surface changes within few Ångstroms. This effect is used in the device of the present invention, which uses extremely small oscillation amplitudes associated with the micro-mechanical structure 6. In one exemplary application, the MEMS device of the invention is used as a probe in a scanning probe microscopy. FIG. 3 shows a probe using the resonant MEMS device of FIG. 1 with a small sharp probe tip 7 disposed on top of the micro-mechanical structure 6. The probe tip 7 is used for scanning microscopy application when the device interacts with atoms on a surface. The tip helps to localize the interaction region and improves the resolution of surface imaging. The probe of the present invention can replace traditional STM tip or a large cantilever in an atomic force microscopy. Because the oscillation amplitude of the structure 6 is in the order of few Ångstroms, the surface imaging using the present invention is more accurate and has a better resolution than prior art surface imaging techniques. In addition, the MEMS device of the present invention provides tunnelling spectroscopy mode. One benefit of the MEMS device of the present invention is that it does not require external devices like piezo motor or laser optical system as a feedback mechanism. Because the amplitude of oscillation of the micro-mechanical structure 6 is compatible with the surface roughness on atomic scale, surface images can be obtained by arranging feedback between the tunnelling current and the amplitude of an alternating electric field.

Figure 4A:
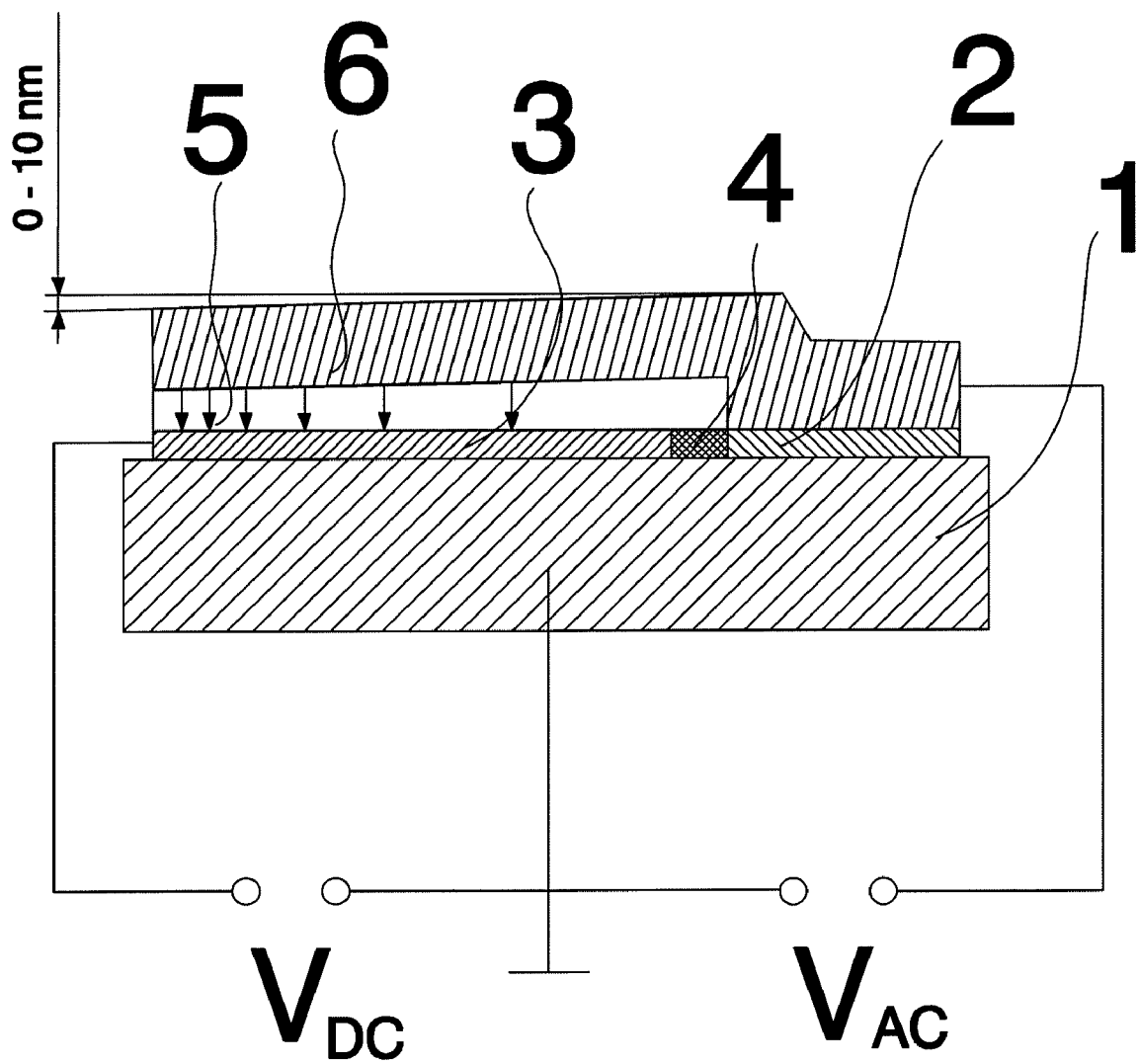
FIGS. 4(a) and 4(b) show side views of the MEMS device of FIG. 1 under different tunnelling effect voltage applications.
Figure 4B:
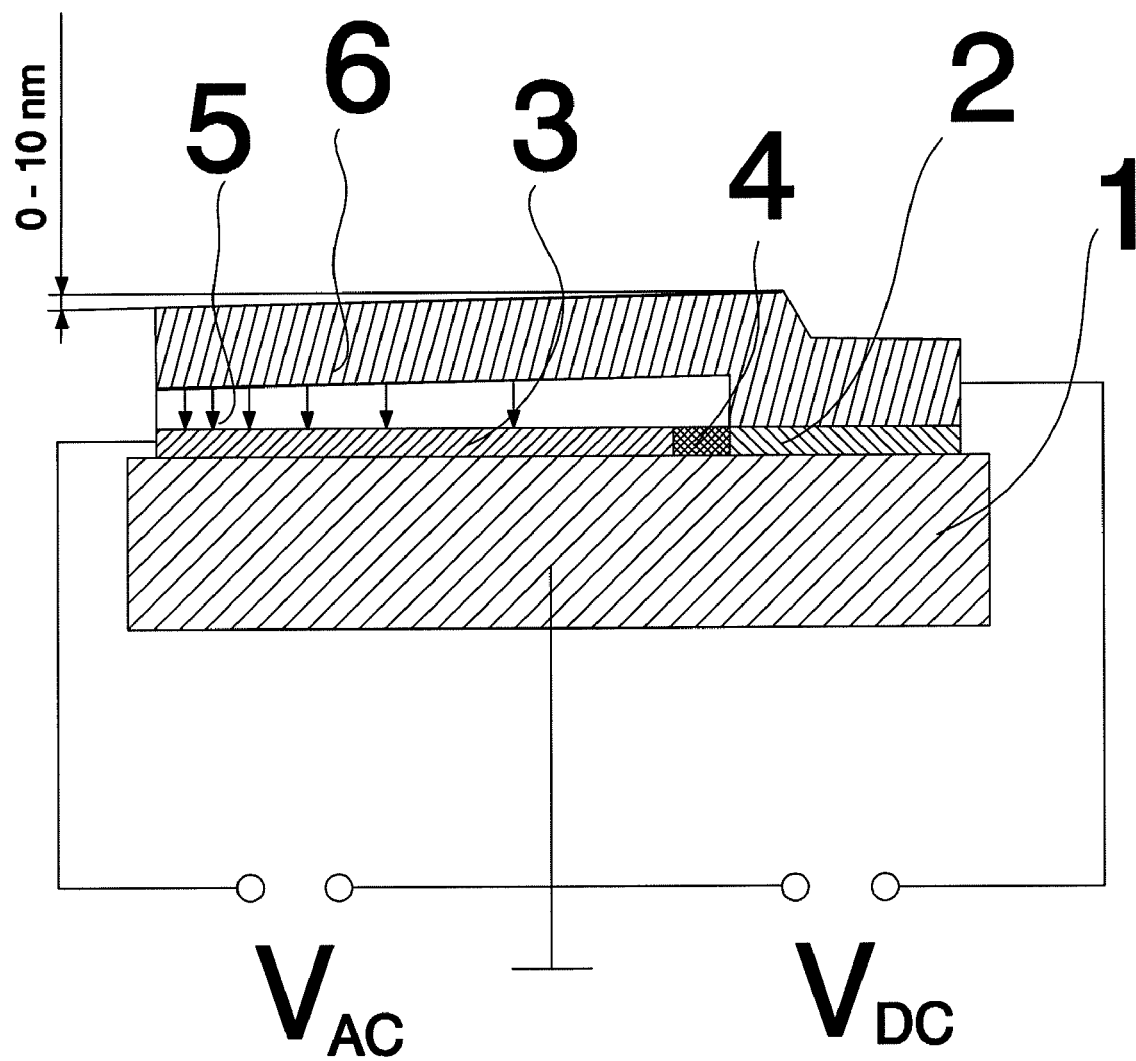

The thickness of the transition layer in the range of 0.5 Ångstrom (Å) to 100 Ångstrom (Å) allows for accurate control of the tunnelling effect by application of one or more AC or DC tunnelling control voltages with increased accuracy. The one or more AC or DC tunnelling control voltages can be applied in a variety of ways. FIGS. 4(a) and 4(b) show the exemplary resonant MEMS device of the present invention at resonance under two different control voltage conditions. FIG. 4(a) shows the micro-mechanical structure 6 being resonated by the application of an AC tunnelling control voltage to the structure itself. A DC tunnelling control voltage is applied to the sensor electrode 3. The AC tunnelling control voltage can have a frequency that preferably matches the natural oscillation frequency of the micro-mechanical structure 6. Such matching allows oscillating the micro-mechanical structure 6 at its maximum oscillation amplitude. FIG. 4(b) shows another way of applying tunnelling control voltages. Under this arrangement, the AC tunnelling control voltage is applied to the micro-mechanical structure 6 and the DC tunnelling control voltage is applied to the sensor electrode 3 for controlling the tunnelling effect. In one exemplary embodiment, the amplitude of the AC tunnelling control voltage is chosen so that the oscillation amplitude (or frequency) of the micro-mechanical structure 6 is in the range 0.5-100 Ångstroms. Such control voltage may be adjustable for changing the oscillation amplitude or frequency. For example, the DC or AC voltage level can be adjusted to adjustably control the tunnelling process. The tunnelling current flow can increase by increasing one or more tunnelling control voltages, and vice versa. In FIG. 4(b), the tunnelling effect current is obtained by applying the control voltage to the sensor electrode 3. Arrows in FIGS. 4(a) and 4(b) show the flow of the tunnelling current between the micro-mechanical structure 6 and the sensor electrode 3 under the control of the DC voltage.

Accordingly, the present invention operates based on the flow of tunnelling electrons within the transition layer of thickness in the range of 0.5 Ångstrom (Å) to 100 Ångstroms (Å), which acts as a tunnelling medium between the resonating micro-mechanical structure 6 and sensor electrode 3. Consequently, the present invention does not rely on a mechanical contact between the micro-mechanical structure 6 and the sensor electrode 3. Instead, the present invention relies on controlling tunnelling effect current generated within the transition medium with the tunnelling effect being controlled within by the application of suitable DC or AC tunnelling control voltages. When the micro-mechanical structure 6 interacts with photons (particles or surfaces), the tunnelling current changes. By detecting such changes, information can be obtained about energies of the photons and magnitude of any forces that interacts with the micro-mechanical structure 6. A large number of photons (or a large force magnitude) shifts the resonant frequency according to the intensity of the photon flux or any interacting force magnitude. Such frequency shift is also measured along with tunnelling current's DC components to both large and small scale microscopy.

The frequency shift can be measured in different ways. In the first case, the frequency sweeps from f1 to f2 where the resonant frequency is inside f1 and f2; and the tunnelling current is measured at a number of points in this region. The maximum current corresponds to the resonant frequency. If the resonance frequency shifts then the maximum current will shift too. In the second case, the frequency is periodically changed around the resonance frequency and a feedback loop changes the position of the frequency following the maximum of the tunnelling current. If the resonance frequency shifts then the feedback provides the proportional shift.

Figure 5A:
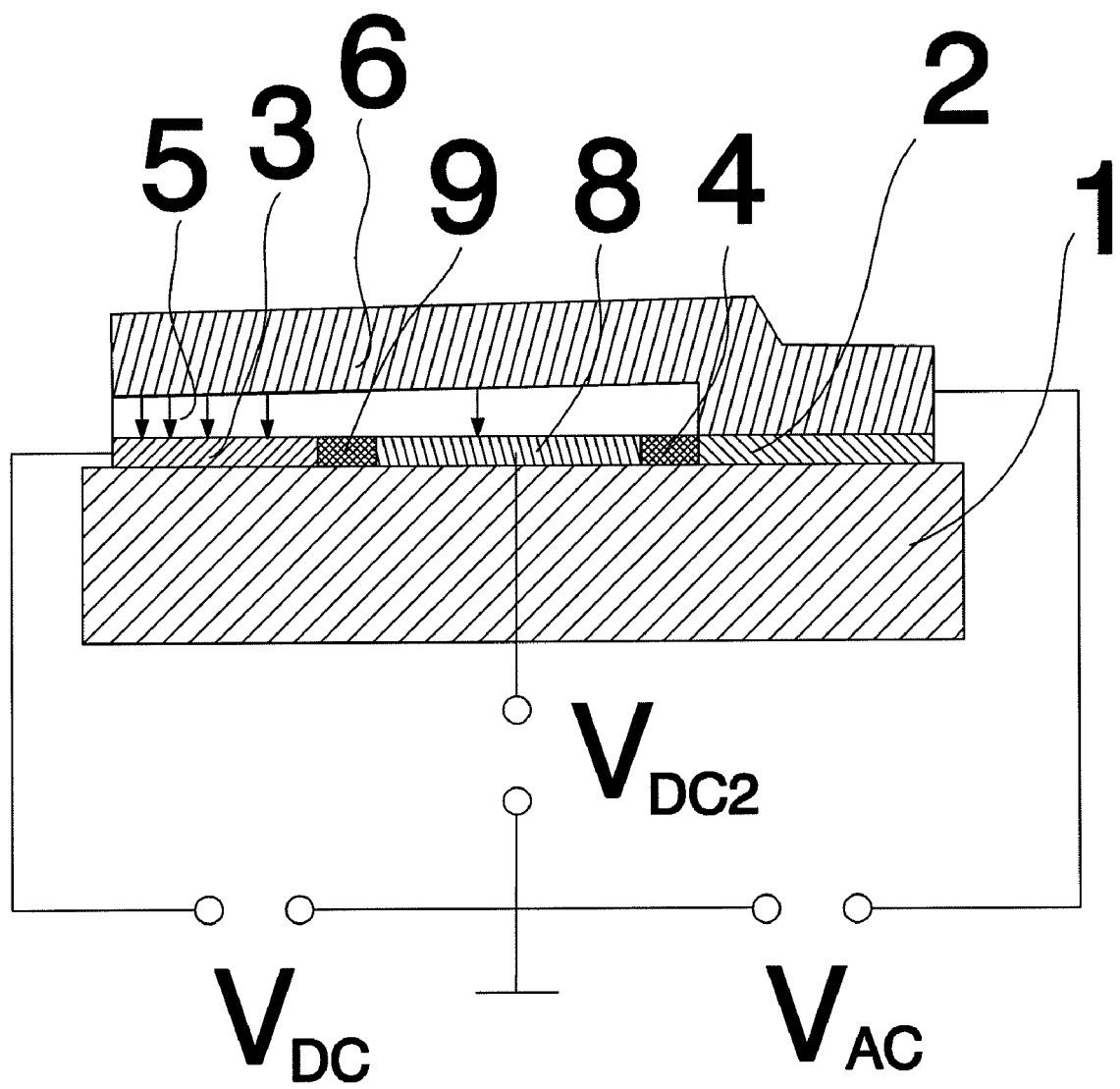
FIGS. 5(a) and 5(b) show a MEMS device according to another exemplary embodiment of the invention under corresponding tunnelling effect voltage applications.
Figure 5B:
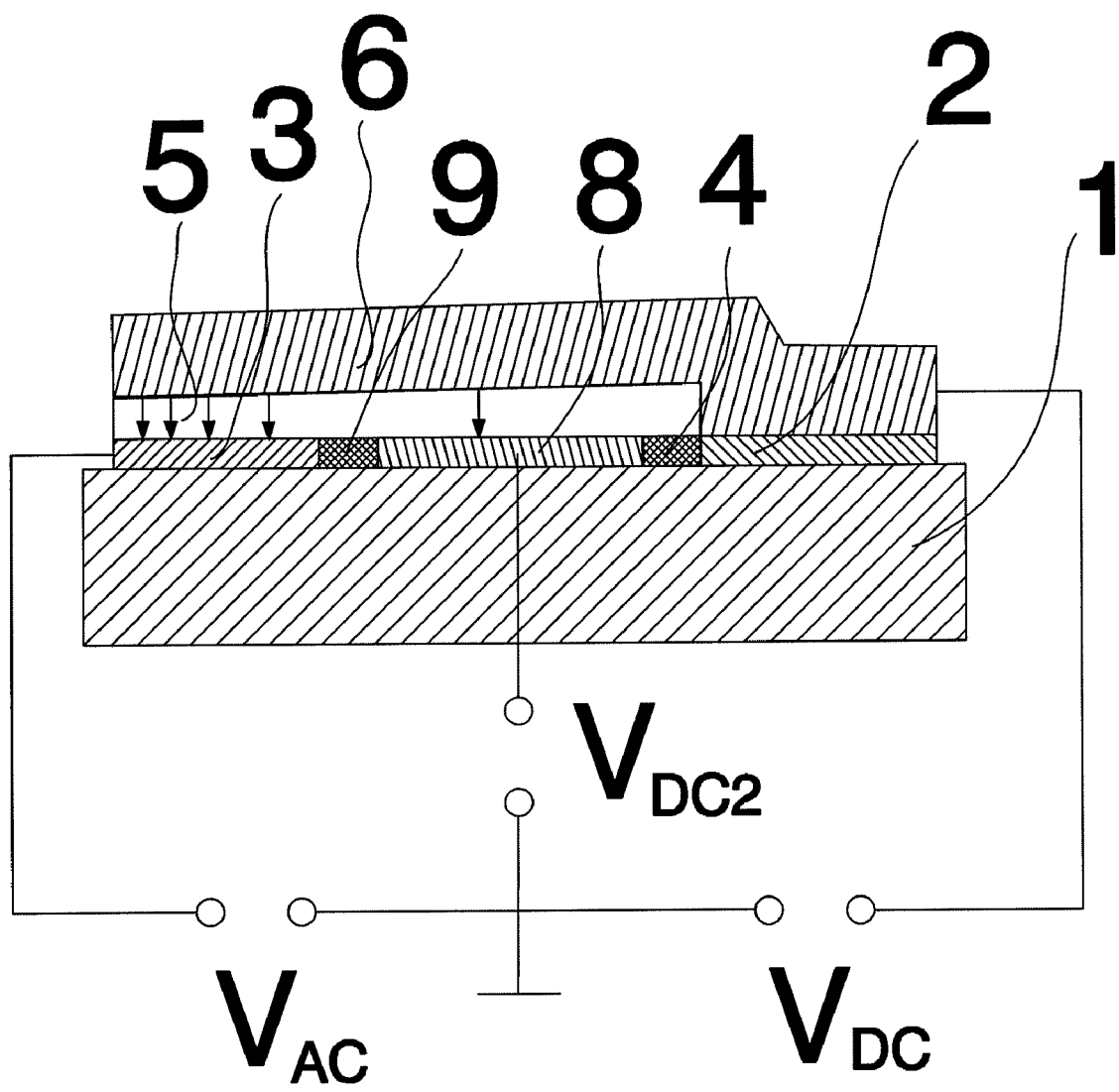

As described above, AC and/or DC voltages are applied between the resonating micro-mechanical structure 6 and the sensor electrode 3 in order to control the tunnelling process. FIGS. 5(a) and 5(b) shows a resonant MEMS device in which an additional deflection control electrode 8 is placed beneath the micro-mechanical structure 6. The electrode 8 can be used for controlling the electrostatic field in the transition layer by adding a pull-in force that acts to deflect the micro-mechanical structure 6. The deflection amplitude of the micro-mechanical structure 6 during resonance can be controlled by application of a DC deflection control signal to the electrode 8 allowing for further control of the tunnelling effect current. FIG. 5(a) shows the micro-mechanical structure 6 being made to oscillate by applying a AC voltage to the micromechanical structure 6 itself. FIG. 5(*b*) shows the application of the AC voltage to the sensor electrode 3 for oscillating the micro-mechanical structure 6. The application of the DC and AC voltages is controlled via a processing unit, e.g., a computer, as further described below.

Figure 6:
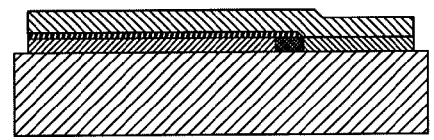
FIG. 6 shows a matrix for imaging objects using the MEMS device of the invention.
Figure 6:
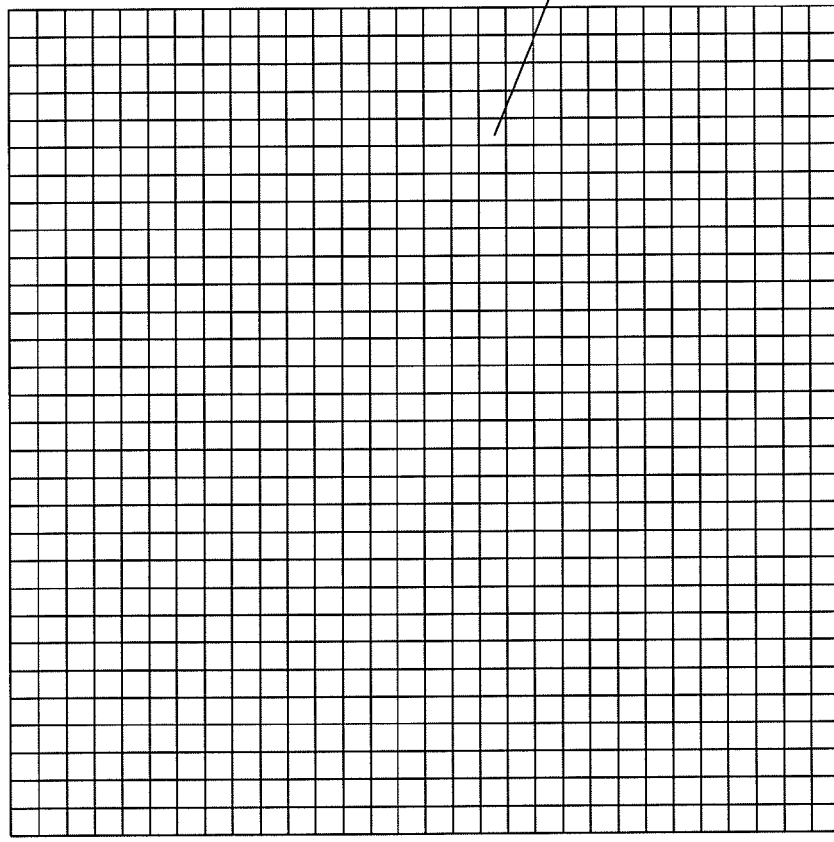

FIG. 6 shows a matrix that can be used for imaging objects. Each resonant MEMS device is working as one pixel. In this case instead of measuring the tunnelling effect current, electrical charge from individual devices can be collected. The devices are equipped with capacitor regions capable of accumulating electrical charge and means to determine the amount of charge. The tunnelling current can flow described by quantum mechanics and more specifically by the tunnelling matrix element multiplied the Fermi distribution function of electrons in a cantilever. This product is integrated over energy range that is controlled by external voltage. For a fixed position between the probe and the sample, the tunnelling effect current is given by the equation:

$$I = \frac{4\pi e}{\hbar} \int_0^{eV} |M|^2 \rho_S(E_F - eV + E)\rho_C(E_F + E) dE$$

where $E_F$ is the Fermi lever, $\rho$ is the density of states that is in case of metal is the Fermi distribution function, M is tunnelling matrix element given by pixel $$M = \frac{\hbar^2}{2m} \int_S (\chi_v^* \nabla \psi_\mu - \psi_\mu \nabla \chi_v^*) dS$$

where ψ and χ are wave functions of the two electrodes. Any change in the Fermi distribution due to interaction between free electrons with photons results in additional tunnelling current that is directly detected by the device. This additional tunnelling current compensates the energy change due to interaction between the cantilever and incident photons or other forces.

When the cantilever oscillates then a DC component of the tunnelling current is given by $$I = \frac{4\pi e\tau}{\hbar l_0 t} \int_0^t g(d(t) - d_t) dt \int_0^{eV} |M|^2 \rho_S(E_F - eV + E)\rho_C(E_F + E) dE,$$

where τ is time during which the cantilever is close enough to the sensor electrode and the tunnelling current is flowing, function g is a gap function, g=0 if d>$d_t$ and g∝$e^{k(d_t-d(t))}$−1 for d<$d_t$. If the cantilever oscillates given by sinusoidal function then the distance is given by d=$d_o$+A cos(wt), where $l_o$ is a gap controlled by DC voltage and A is amplitude of oscillation controlled by AC voltage, w is frequency of oscillation. Therefore, both change in energy of the free electron gas and frequency of oscillation will be detected.

Figure 7:
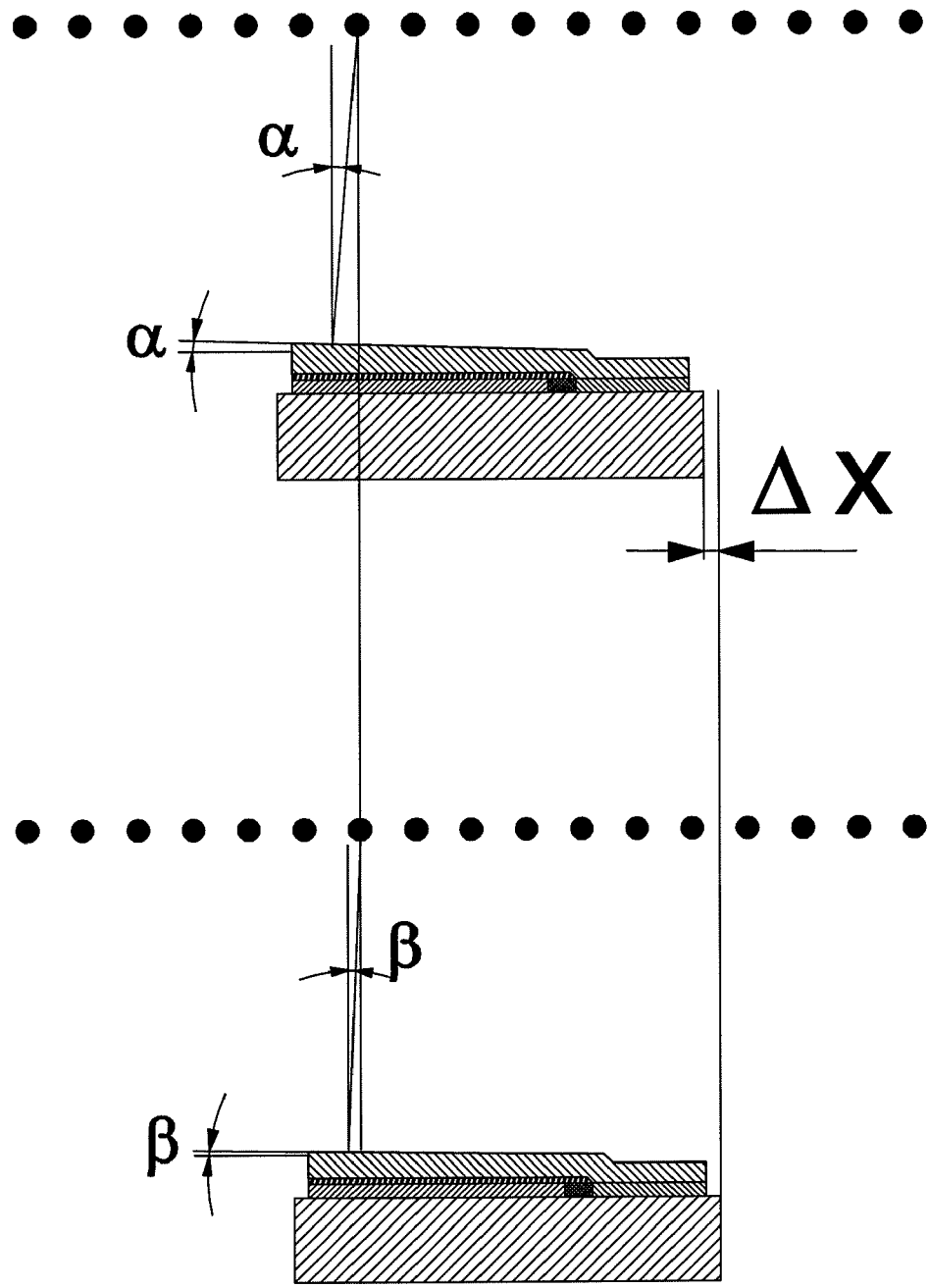
FIG. 7 shows the MEMS devices of the invention used in a 3D imaging application.

FIG. 7 shows a schematic view of the resonant MEMS device for stereo imaging. The stereo effect is obtained by taking images at two different oscillation amplitudes of the micro-mechanical structure 6. The two different amplitudes produce two different angles at which images are taken. When the MEMS device is used in a scanning probe microscopy, the position of the MEMS device at each probing measurement can be precisely controlled. Usually, piezo elements are used for scanning with atomic resolution. Therefore, the difference between the positions at which the same MEMS structure is imaged at two different angles can be calculated and measured very accurately. In this way, the stereo image can be constructed with atomic resolution. This allows for estimation of the size of small, e.g., less than 1 nm, structures in z-direction directly in Ångstroms. More specifically, when two images overlap during viewing, the stereo effect is achieved. This is particularly useful for stereo imaging on micro- and nano-scale for imaging surfaces with a scanning probe microscope. The stereo imaging on nano-scale allows real 3D imaging of surfaces and atomic structures.

Figure 8:
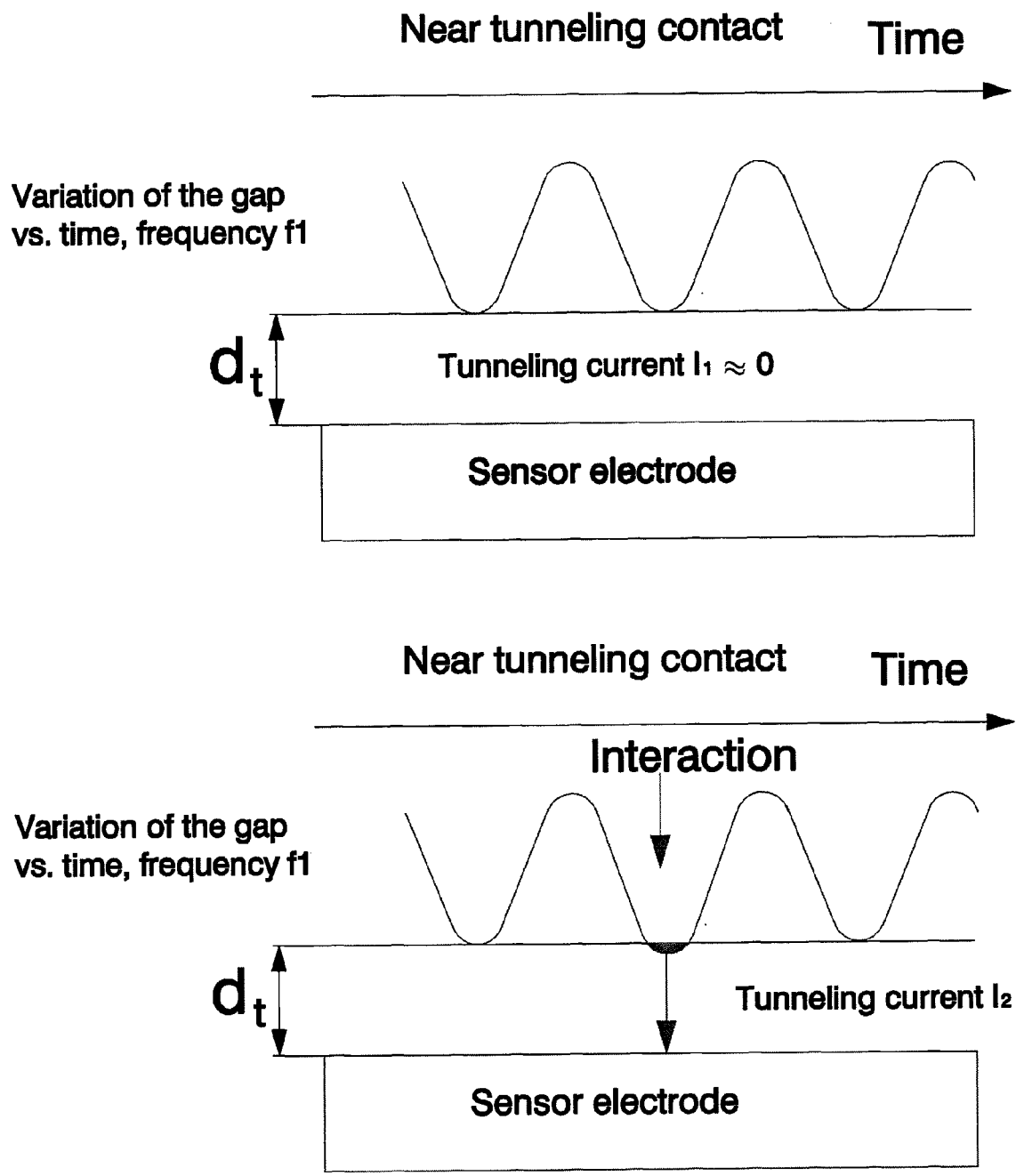
FIG. 8 depicts diagrams corresponding to two operating modes of the MEMS device of the invention.

FIG. 8 shows the MEMS device of the present invention operating in the "near tunnelling point" operating mode. Under this embodiment, the tunnelling current is adjusted to about zero. This mode is performed similar to previous operations but the amplitude of the oscillation at resonance is slightly reduced so that a small increase in the amplitude results in detection of the current. The device is working in a stand-by mode waiting for external forces. The tunnelling occurs almost immediately at the moment when interaction happens.

Figure 9A:
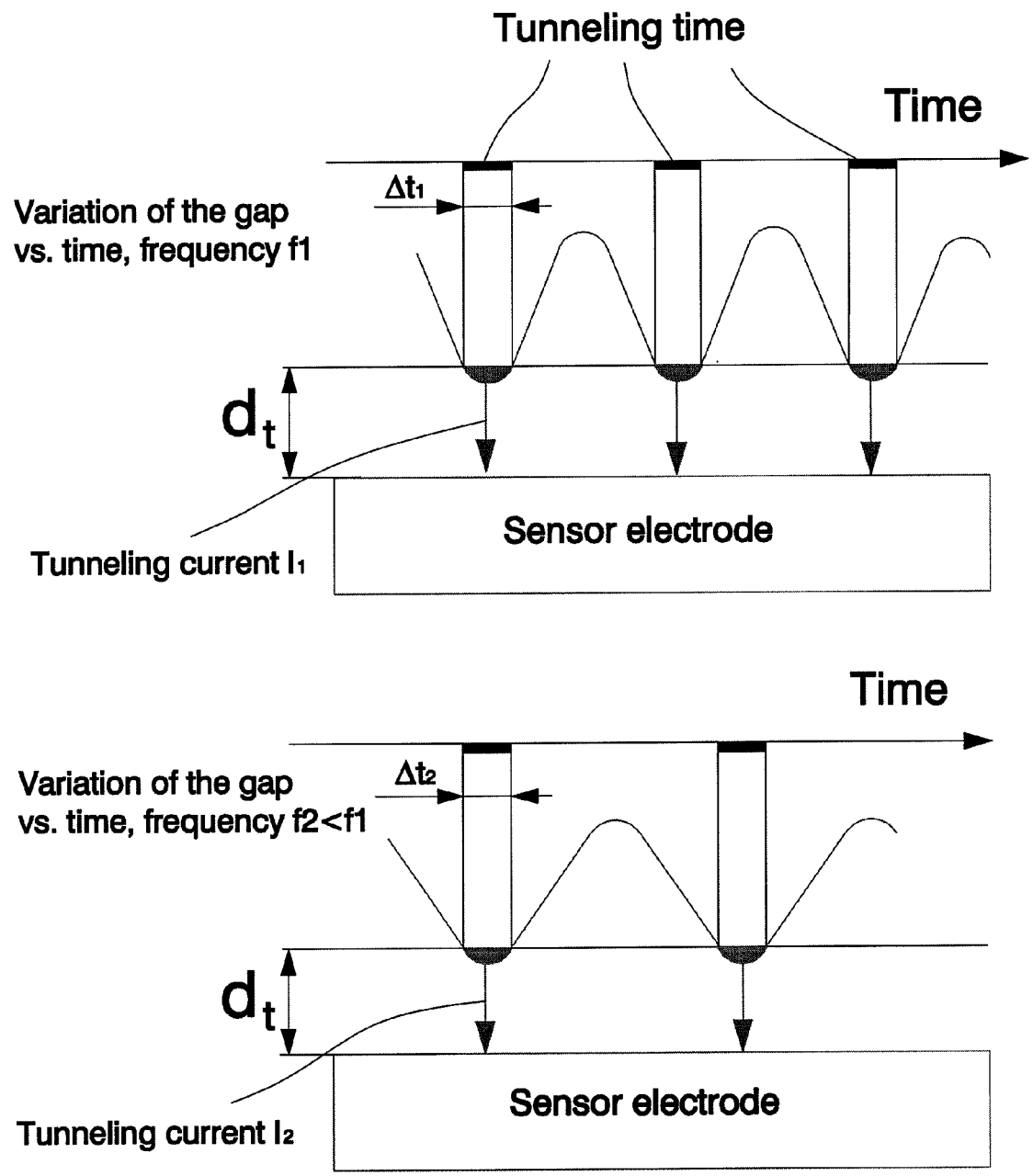
FIGS. 9(a)-9(b) are corresponding tunnelling effect diagrams at frequencies, f1 and f2 and amplitudes, a1 and a2, respectively.
Figure 9B:
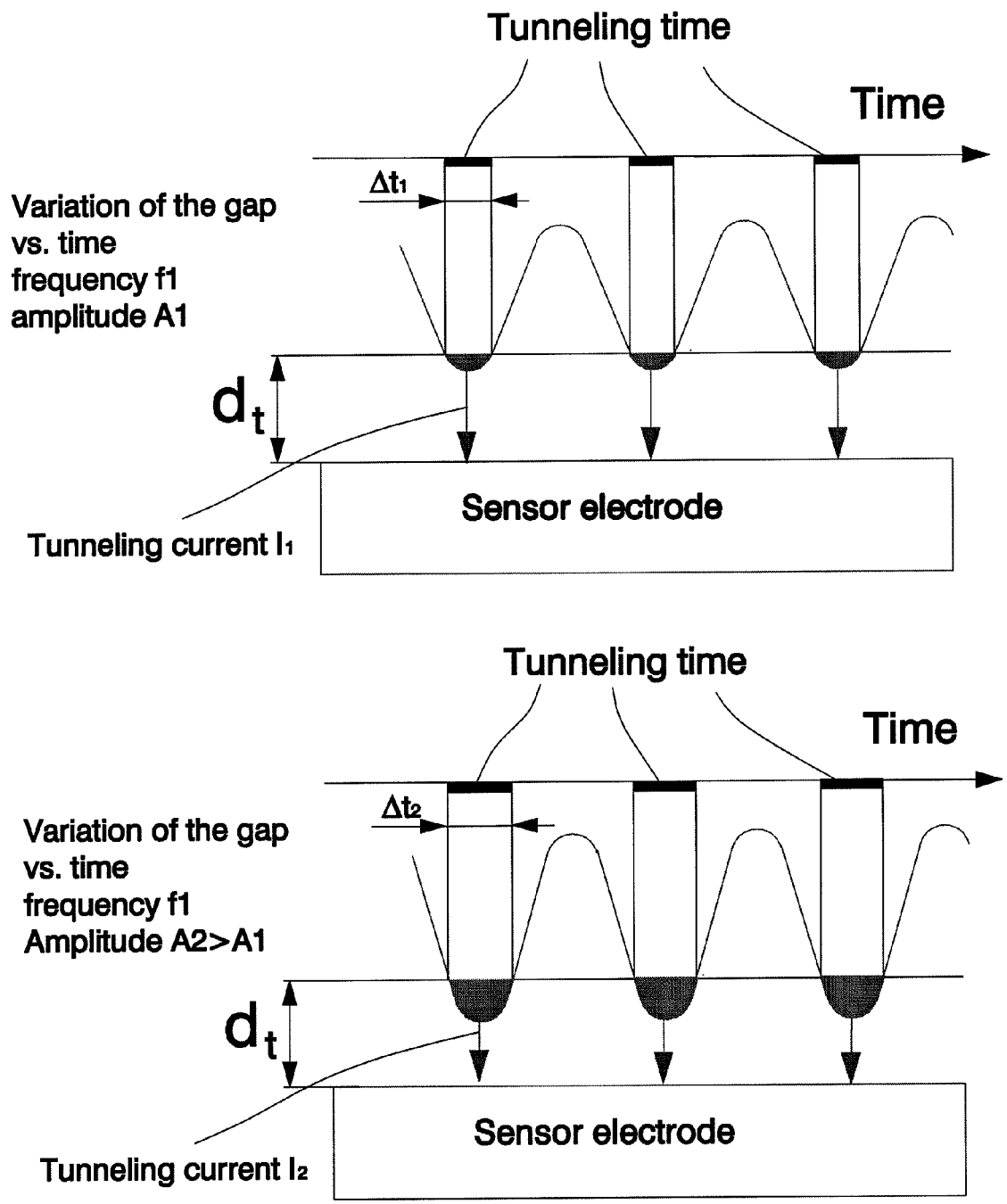

FIG. 9(*a*) illustrates the operation of the MEMS device of the invention when a relatively strong external force, corresponding to number of particles for example, is exerted on the micro-mechanical structure 6, thereby changing its relative oscillating frequency. The DC component of the generated tunnel effect current depends on the total integration time of the produced tunnelling effect current. Such tunnelling effect current is the sum of shorter time periods during which tunnelling occurs, where any change in the frequency is correlated with the tunnelling time and measured current. This figure shows oscillations with equal oscillation amplitudes.

FIG. 9(*b*) shows that change of the DC component of the electric current being caused by change of the oscillation amplitude, which corresponds to relatively weaker external forces. At equal frequencies, the change in the oscillation amplitude results in change of short time periods related to the tunnelling process. In this case, the measured DC component of the current is correlated with the amplitude change. Because small magnitude forces, for example, those resulting from interaction with few photons, cannot shift the resonant frequency, therefore, changes in the magnitude of the tunnelling current are used for measuring small magnitude forces. On the other hand, intensive photon fluxes or stronger magnitude forces of different nature result in change of mechanical oscillation of the resonating structure 6. Accordingly, any shift in the resonant frequency as well as any change in the tunnelling current can be used to measure larger magnitude forces.

Figure 10:
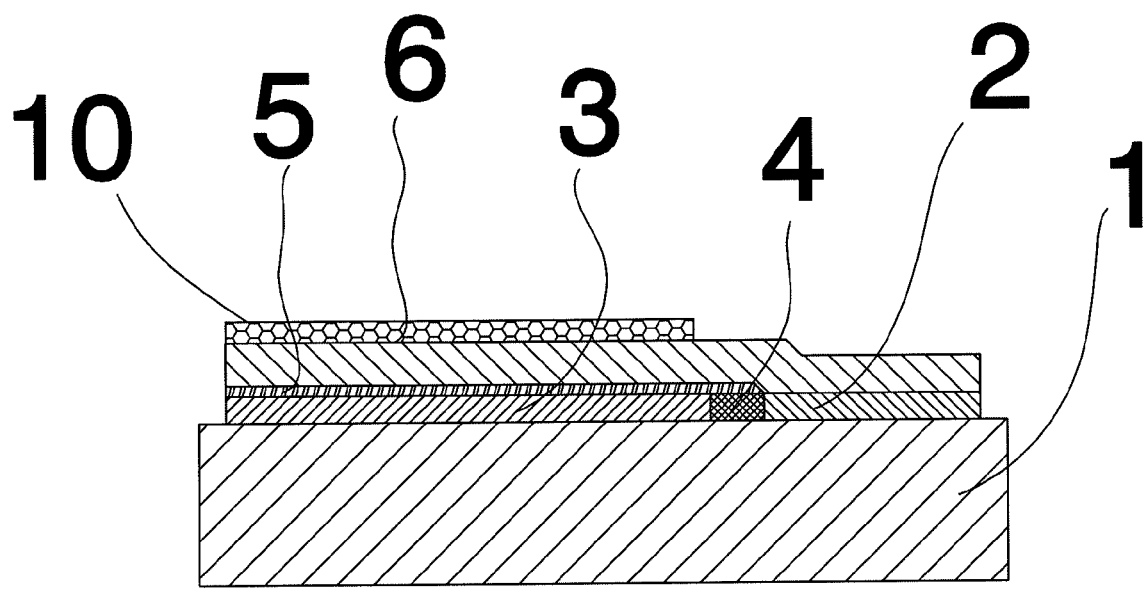
FIG. 10 shows a side view of a MEMS device according to still another exemplary embodiment of the invention.

Small forces may be originated from different sources of photons or atoms. These can be electromagnetic or mechanical forces as well as forces resulted from chemical reactions. Measured phase variations of the tunnelling electron flow correspond to intermediate external forces. The MEMS device of the present invention can be adapted for different environmental conditions. An additional active layer 10 can be formed on top of the micro-mechanical structure 6 as depicted in FIG. 10. The active layer can be composed of different materials ranging from optical coatings to magnetic materials. It can be prepared of specific chemical compositions for detection of chemical reactions.

Figure 11A:
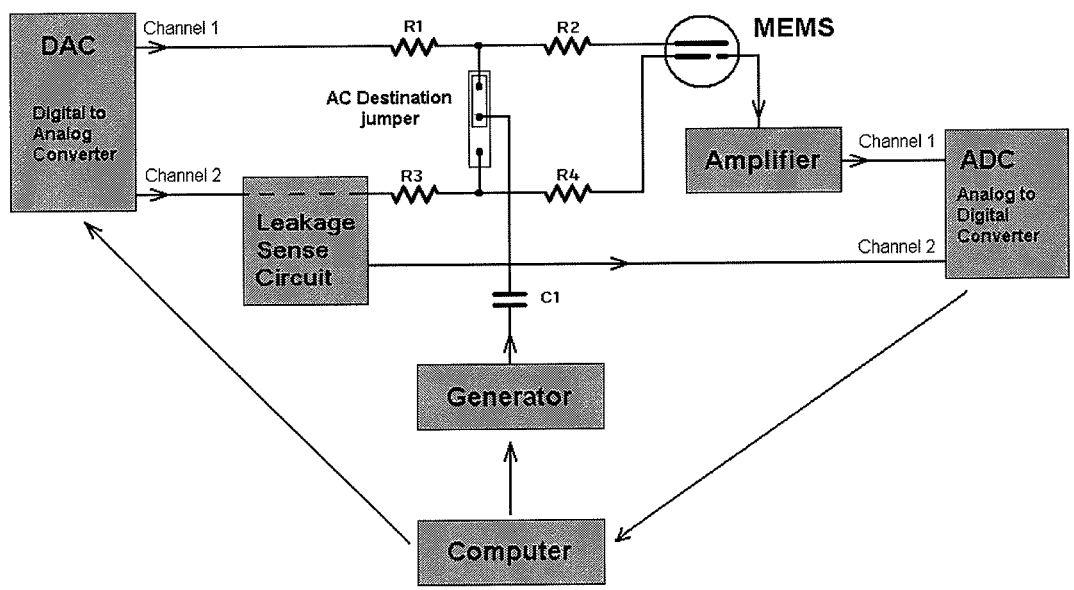
FIGS. 11(a) and 11(b) are combined block and circuit diagrams for applying control voltages to the MEMS device of the invention.

FIG. 11 shows an application specific control and signal processing block that performs various functions involving measurements of voltage, current, magnitude, frequency and phase, adjustment of DC and AC voltages, operating modes involving calibration and sensing, imaging, scanning, etc.

FIG. 11(*a*) and FIG. 11(*b*) are block diagrams of two embodiments of the application specific control and signal processing block 12 of FIG. 5. FIG. 11(*a*) shows a system diagram for measuring tunnelling current resulting from application of AC and DC voltages an exemplary micro-mechanical structure comprising a cantilever and control electrodes. The voltage amplitude and frequency of applied t signals is controllable through a signal generator operating under the control of a processing unit, such as a computer. Channel 1 of digital-to-analog-converter (DAC) provides DC voltage applied to the cantilever and channel 2 provides DC voltage applied to the control electrode. Leakage Sensor Circuit is used to detect possible leakage in MEMS sample between the cantilever and control electrode. Measured leakage current is directed to the second channel of an analog-to-digital-converter (ADC) and can be queried by a software running in the computer. Resistors R1-R4 are used to limit current that may come from DAC to MEMS sample in case of leakage in the latter. They also are used to mix DC voltage coming from DAC with AC voltage coming from generator. AC voltage might be applied either to cantilever or control electrode. This is selected by means of a jumper. The tunnelling current coming from the sensor electrode is amplified and applied to ADC. There are several measurement techniques that might be implemented by software: tunnelling current as a function of control electrode voltage, tunnelling current as a function of generator frequency, phase, time and amplitude, etc. In case resonant frequency of MEMS sample is changing as a result of an external influence to the cantilever, the software might detect it and adjust generator frequency so that it always will be at resonant. To do this, software shall constantly do some small frequency sweeping around resonant frequency and measure changes in tunnelling current as a result of this sweeping.

Figure 11B:
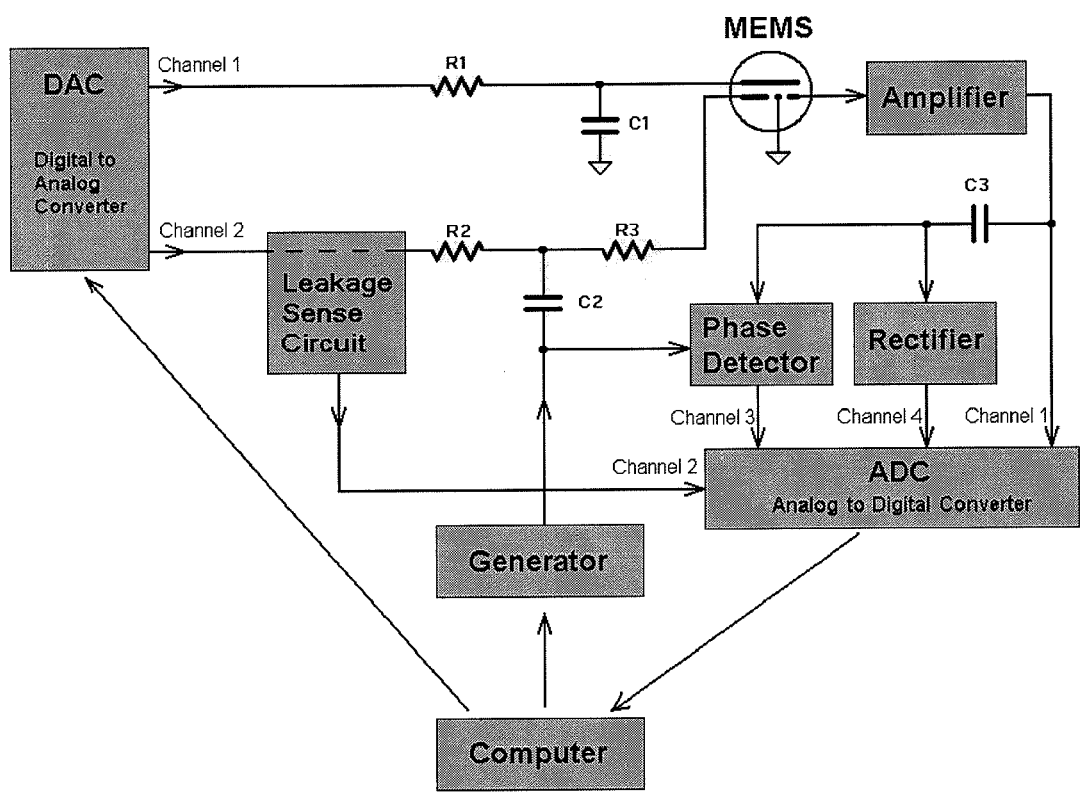

FIG. 11(b) shows a diagram that allows for measuring and analyze AC components of tunnel currents. Rectifier is used to measure amplitude of AC component in tunnelling current and Phase Detector is used to measure phase of it. AC voltage from generator in this case can be applied to control electrode. An additional screening electrode is added between the control electrode and the sensor electrode. By controlling the phase of AC component of tunnelling current, the generator frequency is adjusted to the cantilever resonance. The phase between AC voltage applied to cantilever and its mechanical movement depends on generator frequency. It has one sign in case generator frequency is below resonance and an opposite sign if it is above. The phase of AC component in tunnel current is expected to coincide with the phase of mechanical movement of cantilever.

FIGS. 12(a)-12(f) show an exemplary fabrication process for the MEMS device of the present invention. The device can be made on a Si wafer by using a fabrication process that is similar to a CMOS process. The fabrication process can include, for example, lithography, deposition, etching, lift-off and diffusion, for formation of the nano-gap between the micro-mechanical structure 6 and sensor electrode as well as other controls electrodes and contacts. An exemplary fabrication process prepares an isolation layer on a substrate. Si dioxide is one known material for electrical isolation between the electrodes.

Figure 12:
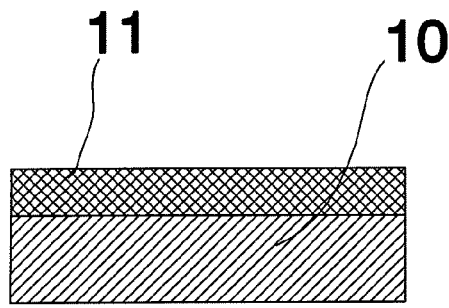
FIGS. 12(a)-12(f) are corresponding side view of structures created during fabricating the exemplary fabrication process for the MEMS device of the invention.
Figure 12:
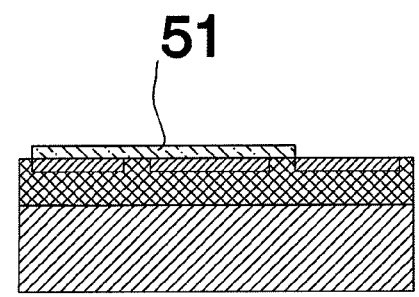
Figure 12:
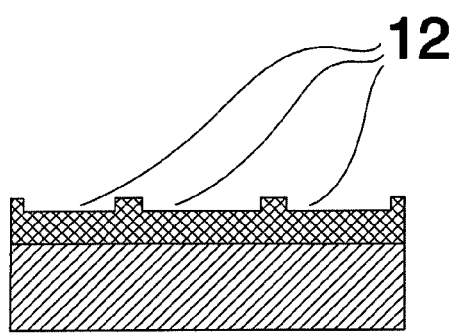
Figure 12:
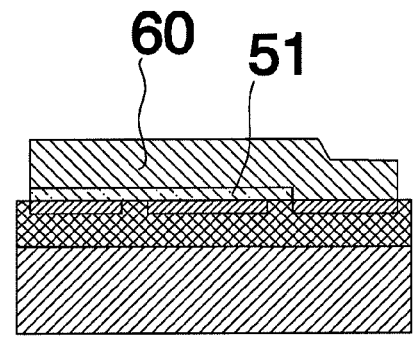
Figure 12:
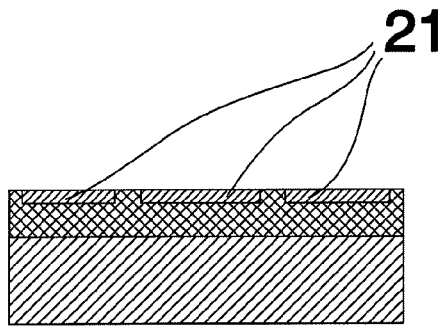
Figure 12:
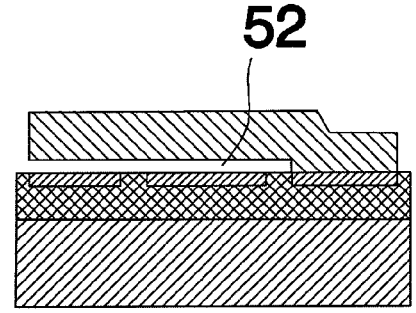

FIG. 12(a) shows a substrate for the MEMS device produced by thermal oxidation of a Si wafer 10 at temperature about 1000-1200 degree Celsius to form a $SiO_2$ insulation layer 11 as a top layer. The thickness of the $SiO_2$ layer can be about 1 μm. Contact pads and electrodes can be created on the $SiO_2$ layer by such techniques as optical lithography, oxide etching, metal deposition and removal (lift-off).

FIG. 12(b) shows the formation of grooves 12 on the $SiO_2$ layer 11 by for example, plasma etching the layer. As shown in FIG. 12(c), metal layers 21 having flat and smooth surfaces are formed on the $SiO_2$ layer according to the grooves' geometries. Exemplary metal layers are gold, aluminium, etc. The thicknesses of the metal layers, which can be equal to the depth of the grooves, is selected to provide the necessary conductivity to the metal layers 21. In one exemplary embodiment, a metal thickness of about 300 nm is selected for sufficient conductivity, and a $SiO_2$ layer thickness of about 700 nm is selected for electrical isolation. In one embodiment, the metal layers 21 are deposited followed by lift-off in a remover (chemical liquid).

FIG. 12(d) shows a thin transition layer 51 deposited on top of the structure of FIG. 12(c). The transition layer 51 has a thickness corresponding to the nano-gap of the MEMS device of the present invention. The chemical composition of this layer is correlated with the chemical composition of the MEMS structure in order to provide diffusion of atoms and separation of the two materials at distances of few Ångstroms. The transition layer 51 can be a metal oxide, nanotubes, semiconductor, polymer, etc. For example, in case of MEMS structure made of titanium Ti, titanium oxide can be used as the transition layer. Such layer can be deposited, for example, by sputtering. Thickness of the transition layer may vary from few nm to few tens of nm. The resistivity of the Ti oxide layer can be controlled by adding Niobium atoms into the layer, for example, during a deposition process or afterwards.

The micro-mechanical structure on top of the structure of FIG. 12(d) can be created using lithography, deposition and releasing the MEMS structure (for example, using lift-off). Material for the structure depends on the material of the transition layer. Depending on application, the structure 60 shown in FIG. 12(e) can be made of metal, semiconductor or other materials. For example, it can be made of Ti. Physical diffusion may be used for formation of the nano-gap. When two compatible materials are in contact with each other, then atoms at the interface can slightly change their positions due to physical diffusion at the interface. At suitable conditions, the two materials can separate from each other and a small nano-gap can be formed. The diffusion takes place within few atomic layers and it can be called nano-diffusion. For example, the nano-gap 52 shown in FIG. 12(f) can be formed between the MEMS structure made with transition layer made of Ti and thin layer made of Ti oxide. The diffusion process can be enhanced, for example, by increasing the temperature.

According to the foregoing, a MEMS device according the present invention comprises a substrate providing electrical isolation for at least two planar electrodes that are formed on top of the substrate. A resonating micro-mechanical structure is fixed on a first electrode and suspended above a second electrode—the first electrode being the micro-mechanical structure 6 and the second electrode being the sensor electrode 3. The micro-structure is separated from the second electrode by a very thin transition medium. The thickness of the transition medium is selected to provide for flow of tunnelling effect electrons between the micro-mechanical structure and the second electrode. The transition layer can be deformable so that electrostatic forces between the second electrode and the micro-mechanical structure can compress it. The quantum mechanical tunnelling probability increases when the transition medium becomes thinner, resulting in increased tunnelling effect current. The transition layer can also be made of solid state material, metal oxide, alloy, semiconductor, nanotubes, polymer, or air gap in thickness that is in the order of few nanometers. The deformation can be in the range from a 0.01 nano-meter to few nano-meters.

At resonance, the deformation of the transition medium varies according to the oscillating frequency of the micromechanical structure 6. At maximum compression, the thickness of the transition medium is minimal and tunnelling of electrons reaches maximum. Resonance can be established by applying a periodic voltage, e.g., an AC voltage, to the micro-mechanical structure. When frequency of the periodic voltage matches the natural frequency of mechanical resonance, the micro-structure oscillates at its resonance. The mechanical resonance can also be established by applying a periodic voltage to the second electrode. When the device interacts with photons, particles, atoms, electromagnetic fields or is influenced by an external force, the tunnelling current changes based on such interaction characteristics as the number, frequency and/or magnitude of particles, fields, chemical reactions and forces. This change is measured, for example, in terms of a DC component of the tunnelling current, for sensing or detecting various parameters, including the magnitude of the external force. The position of resonance peak can also shift as a result of such interaction. The shift of the resonant frequency can also be measured for sensing purposes.

The invention claimed is:

1. A method of producing a resonant MEMS device:
   creating an insulation layer on top of a substrate;
   disposing at least one sensor electrode on the insulation layer;
   electrically coupling a transition layer having a thickness in the range of 0.5 Angstrom (Å) to 100 Angstroms (Å) to the sense electrode via multiple flows of tunneling electrons within the transition layer;
   coupling a micro-mechanical structure to the at least one sense electrode through the transition layer, wherein said micro-mechanical structure is configured to generate the multiple flows of tunneling electrons within the transition layer;
   resonating the micro-mechanical structure at an oscillation amplitude and an oscillation frequency;
   controlling the tunnelling effect via at least one control voltage; and
   sensing, at the at least one sensor electrode, an electrical characteristic associated with a change in the oscillation amplitude or oscillation frequency of the micro-mechanical structure.

2. A resonant MEMS device, comprising:
   a substrate;
   at least one sensor electrode disposed on the substrate;
   a transition layer having a thickness in the range of 0.5 Angstrom (Å) to 100 Angstroms (Å) electrically coupled to the sense electrode via multiple flows of tunneling electrons within the transition layer;
   a micro-mechanical structure coupled to the at least one sense electrode through the transition layer resonating at an oscillation amplitude and an oscillation frequency, the micro-mechanical structure being configured to generate the multiple flows of tunneling electrons within the transition layer, wherein at least one control voltage controls the tunnelling effect for sensing, at the at least one sensor electrode, an electrical characteristic related to a change in the oscillation amplitude or oscillation frequency of the micro-mechanical structure.

3. The resonant MEMS device of claim 2, wherein the at least one control signal comprises a first control signal applied to the at least one sensor electrode and a second control signal applied to the micro-mechanical structure.

4. The resonant MEMS device of claim 2, wherein the at least one control voltage is adjustable for changing at least one of the oscillation amplitude or oscillation frequency of the micro-mechanical structure.

5. The resonant MEMS device of claim 2, wherein the at least one control voltage comprises at least one of an AC voltage or a DC voltage.

6. The resonant MEMS device of claim 5, wherein the frequency of the AC voltage is substantially equal to the oscillation frequency of the micro-mechanical structure.

7. The resonant MEMS device of claim 5, wherein the frequency of the AC voltage is adjustable for changing at least one of the oscillation amplitude or oscillation frequency of the micro-mechanical structure.

8. The resonant MEMS device of claim 5, wherein the DC control voltage is applied to the at least one sensor electrode.

9. The resonant MEMS device of claim 2, wherein the at least one sensor electrode comprises a first sensor electrode and a second sensor electrode insulated from first sensor electrode, wherein a first control voltage is applied to the first sensor electrode and a second control voltage is applied to the second sensor electrode.

10. The resonant MEMS device of claim 2, wherein the electrical characteristic comprises at least one of an amplitude, frequency or phase of the flowing one or more electrons.

11. The resonant MEMS device of claim 2, wherein the electrical characteristic comprises a DC component associated with the flow of the one or more electrons.

12. A MEMS system, comprising:
   a resonant MEMS device, comprising:
      a substrate;
      at least one sensor electrode disposed on the substrate;
      a transition layer having a thickness in the range of 0.5 Angstrom (Å) to 100 Angstroms (Å) electrically coupled to the sense electrode via multiple flows of tunneling electrons within the transition layer;
      a micro-mechanical structure coupled to the at least one sense electrode through the transition layer resonating at an oscillation amplitude and an oscillation frequency, the micro-mechanical structure being configured to generate the multiple flows of tunneling electrons within the transition layer, wherein at least one control voltage controls the tunnelling effect for sensing, at the at least one sensor electrode, an electrical characteristic related to a change in the oscillation amplitude or oscillation frequency of the micro-mechanical structure; and
   a processing unit that controls the at least one control voltage in response to a change in the electrical characteristic sensed at the sensor electrode.

13. The MEMS system of claim 12, wherein the processing unit adjusts the control voltage to maintain at least one of the oscillation amplitude or oscillation frequency of the micro-mechanical structure at a reference.

14. The MEMS system of claim 13, wherein the processing unit processes sense signals associated with the flow of electrons due to external forces acting on the micro-mechanical structure based on the reference.

15. The MEMS system of claim 14, wherein the processing unit adjusts the control voltage to prevent the flow of the one or more electrons when the micro-mechanical structure is at resonance.

* * * * *